(12) United States Patent
Jiang et al.

(10) Patent No.: US 7,095,768 B2
(45) Date of Patent: Aug. 22, 2006

(54) INDEX GUIDED VCSEL AND METHOD OF FABRICATION

(75) Inventors: Wenbin Jiang, Thousand Oaks, CA (US); Michael Y. Cheng, Thousand Oaks, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 237 days.

(21) Appl. No.: 10/779,894

(22) Filed: Feb. 17, 2004

(65) Prior Publication Data

US 2005/0180477 A1    Aug. 18, 2005

(51) Int. Cl.
*H01S 5/00*        (2006.01)
(52) U.S. Cl. .................. 372/45.01; 372/46.01
(58) Field of Classification Search ............ 372/45, 372/45.01, 46.01
See application file for complete search history.

(56) References Cited

U.S. PATENT DOCUMENTS 5,399,885 A * 3/1995 Thijs et al. .................. 257/95
6,160,834 A * 12/2000 Scott .......................... 372/96
6,372,533 B1 * 4/2002 Jayaraman et al. ........... 438/22
6,707,071 B1 * 3/2004 Hashimoto et al. ........... 257/94

* cited by examiner

*Primary Examiner*—Minsun Oh Harvey
*Assistant Examiner*—Tuan N. Nguyen
(74) *Attorney, Agent, or Firm*—Allen, Dyer, Doppelt Milbrath & Gilchrist, P.A.

(57) ABSTRACT

A reliable high frequency VCSEL includes a lower distributed Bragg reflector (DBR), an active region, and an upper DBR. A cylindrical volume is etched from the upper DBR to define a mesa with a lower surface of the cylindrical volume forming an angle greater than ninety degrees with the side wall of the mesa. An isolation trench is etched in the lower surface of the cylindrical volume concentric with the mesa and extending through the active region. A portion of the side wall of the mesa and the lower surface of the cylindrical volume are proton implanted. The upper DBR is planarized using low-k dielectric materials and n and p electrical contacts are coupled to opposite sides of the active region for supplying operating current thereto.

20 Claims, 2 Drawing Sheets

INDEX GUIDED VCSEL AND METHOD OF FABRICATION

FIELD OF THE INVENTION

This invention relates to vertical cavity surface emitting lasers and, more particularly, to semiconductor lasers which operate reliably at high frequencies.

BACKGROUND OF THE INVENTION

Vertical cavity surface emitting lasers (hereinafter referred to as "VCSELs") have become the dominant light source for optical transmitters used in short-reach local area networks and storage area network applications, in which a multi-mode optical fiber is used for data transmission. VCSELs are low cost micro-cavity devices with high speed, low drive current and low power dissipation, with desirable beam properties that significantly simplify their optical packaging and testing. In order to extend the application of VCSELs to higher speed applications, the VCSEL must be capable of operating reliably at frequencies of up to 10 GHz.

Commercial oxide confined VCSELs have been widely deployed in the field. However, due to intrinsic mechanical stress introduced by the oxidation in the VCSEL fabrication, oxide confined VCSELs are not as reliable as, for example, proton (or ion) implanted VCSELs with higher random failure rates. Prior art VCSELs which include an oxide confinement may operate at 10 GHz, but they suffer from poor reliability. Prior art ion implanted VCSELs typically operate at about 1 GHz, but are more reliable than VCSELs with oxide confinement. Although certain stress relief methods may be introduced to reduce the random failure rate, the oxidation process is too sensitive to the temperature, materials composition, and gas pressure during device fabrication and, therefore, the oxide confinement process is not a consistent manufacturing process for VCSELs.

Ion implanted VCSELs are relatively more reliable. However, ion implanted devices do not perform well at higher speeds and, therefore, their applications are limited to data rates around 1 Gbps. The speed of an ion implanted VCSEL is limited by several factors. One factor is the lack of a good index guiding for the optical mode. Another factor is from a size limitation due to a deep implant where the typical implant depth may be more than three microns. Further, the implant has a distribution with a large straggle and a large standard deviation. With a large implant distribution and the poor current confinement of a heavily doped mirror, the size is typically more than 20 microns wherein the speed is limited to less than 2 GHz.

Therefore, there is a need to develop a reliable high performance VCSEL for high speed optical communications.

Accordingly, it is an object of the present invention to provide new and improved VCSELs that operate reliably at high frequencies.

It is another object of the present invention to provide new and improved VCSELs with reduced current leakage and device capacitance.

SUMMARY OF THE INVENTION

Briefly, to achieve the desired objects of the instant invention in accordance with a preferred embodiment thereof, a reliable high frequency vertical cavity surface emitting laser (VCSEL) is provided. The VCSEL includes a lower distributed Bragg reflector, an active region positioned on the lower distributed Bragg reflector, and an upper distributed Bragg reflector positioned on the active region. A cylindrical volume is etched from the upper distributed Bragg reflector so as to define a mesa with a substantially vertical side wall concentrically surrounded by the cylindrical volume. An isolation trench is etched in a lower surface of the cylindrical volume concentric with the mesa. An implant region is formed in the cylindrical volume, including a portion of the side wall of the mesa and a portion of the upper distributed Bragg reflector below the lower surface of the cylindrical volume. The cylindrical volume is filled with a dielectric or insulating material to planarize the VCSEL for further isolation and passivation. Electrical contacts are coupled to opposite sides of the active region for supplying operating current thereto.

The desired objects of the instant invention are further achieved through a novel method of fabricating a high frequency vertical cavity surface emitting laser. The method includes providing a lower distributed Bragg reflector on a substrate, an active region on the lower distributed Bragg reflector, and an upper distributed Bragg reflector on the active region. The method also includes etching a cylindrical volume from the upper distributed Bragg reflector to define a mesa with a substantially vertical side wall, the cylindrical volume extending into the upper distributed Bragg reflector to a lower surface adjacent the active region and etching an isolation trench in the lower surface of the cylindrical volume concentric with the mesa and extending through the active region. The method further includes a step of implanting a portion of the side wall of the mesa and the lower surface of the cylindrical volume and planarizing the upper distributed Bragg reflector. Finally, coupling n and p electrical contacts are coupled to opposite sides of the active region for supplying operating current thereto.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE DRAWINGS

Figure 1:
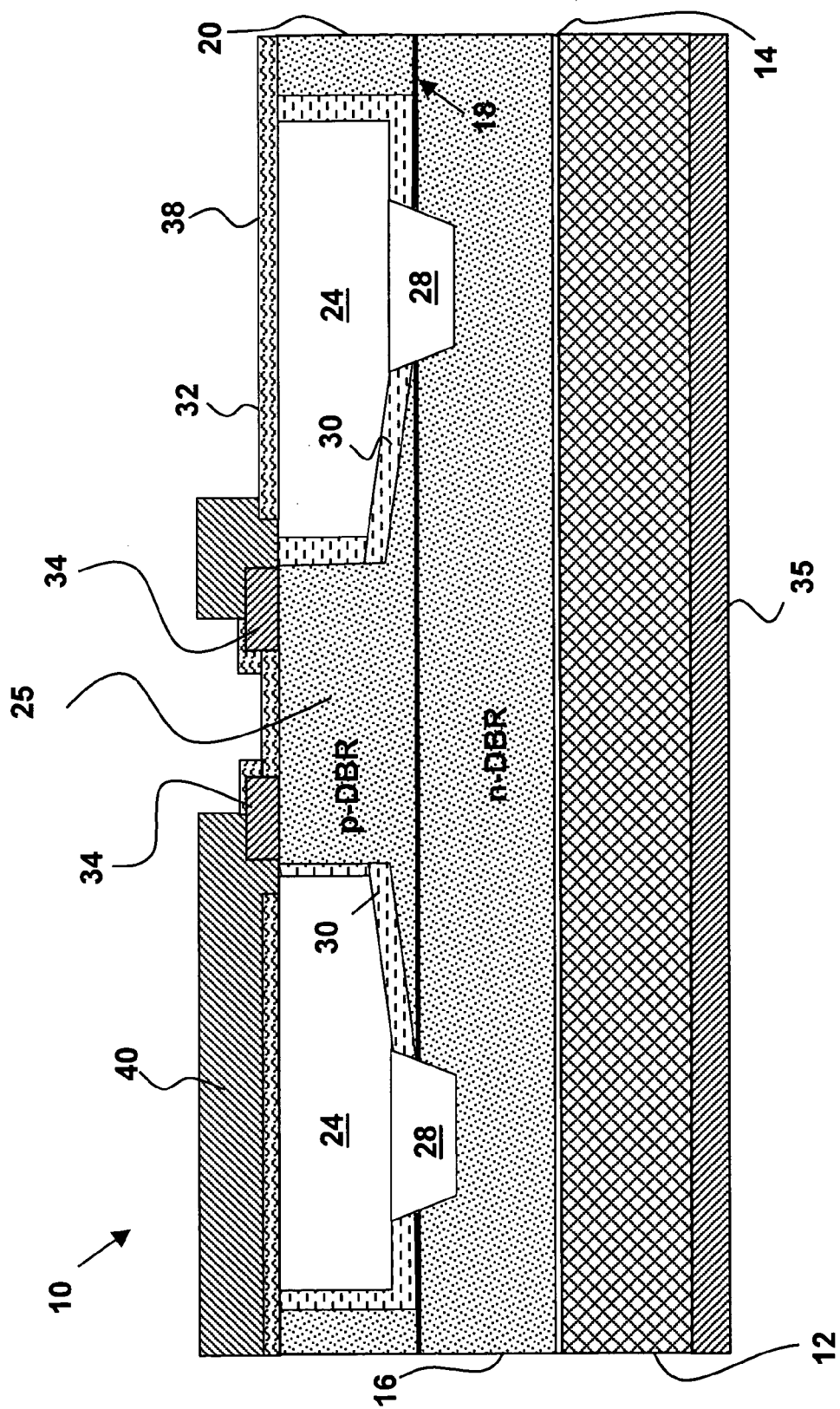
FIG. 1 is a simplified sectional view of a high speed vertical cavity surface emitting laser in accordance with the present invention.
Figure 2:
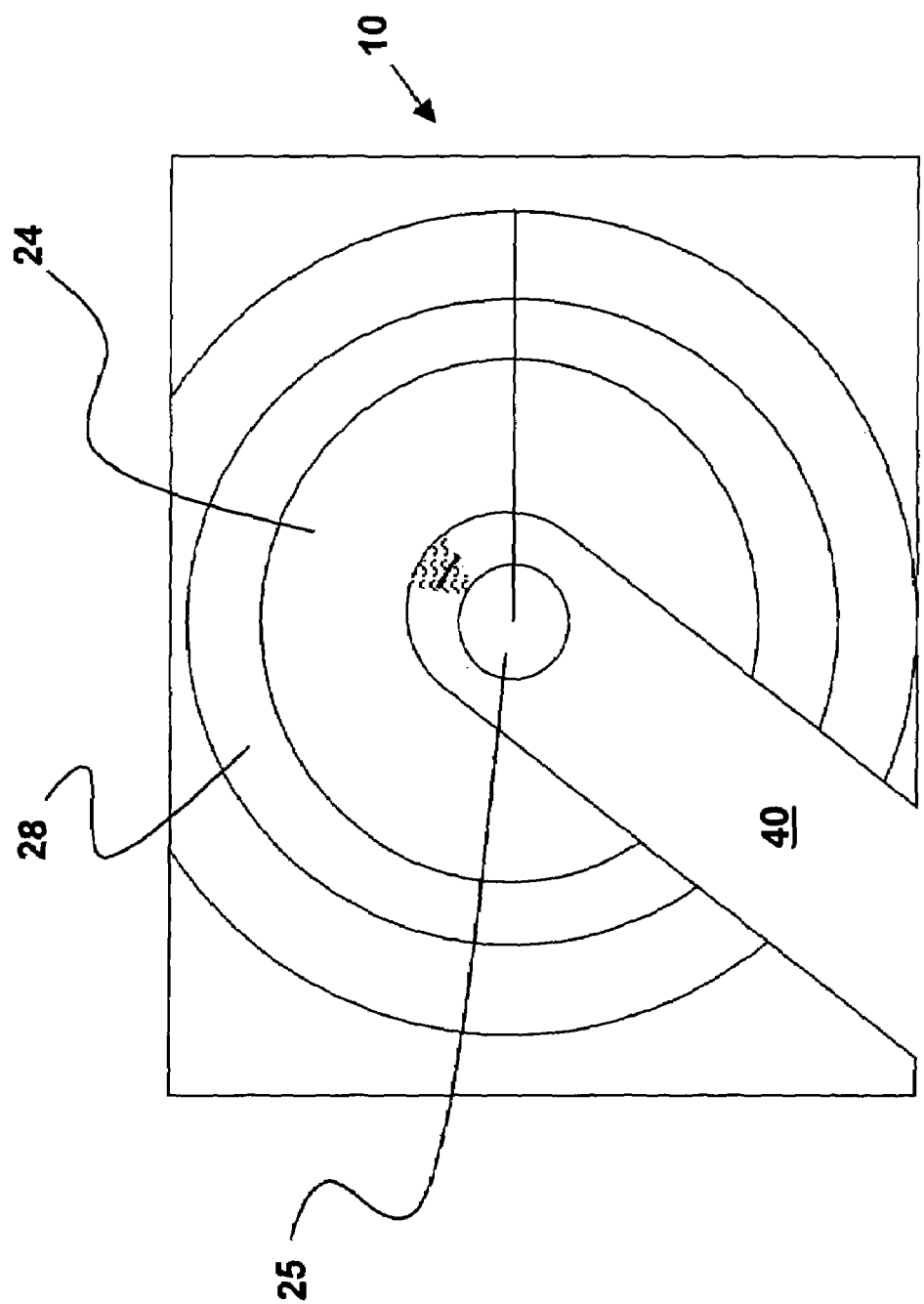
FIG. 2 is a simplified top plan view of the high speed vertical cavity surface emitting laser illustrated in FIG. 1.

Turning now to FIG. 1, a simplified sectional view of a vertical cavity surface emitting laser (VCSEL) 10 is illustrated. Also, FIG. 2 illustrates a top plan view of complete VCSEL 10, which may be referred to in addition to FIG. 1 throughout this discussion. VCSEL 10 includes a substrate 12 which may be, for example, some convenient single crystal semiconductor material, such as gallium arsenide (GaAs) or the like. As is well known in the art, in most instances a thin buffer layer 14 of the same material is provided to ensure a smooth crystalline surface for further growth processes. Layer 14 is considered part of the substrate in this disclosure. A lower mirror stack or distributed Bragg reflector (DBR) 16 is grown on the upper surface of substrate 12. An active region 18 which, as is known in the art, may include cladding regions or the like (not shown) on opposite sides, is grown on the upper surface of DBR 16. An upper mirror stack or distributed Bragg reflector (DBR) 20 is grown on the upper surface of active region 18. As is understood by those skilled in the art, the various layers and/or regions described above are generally grown epitaxially in a well known continuous procedure. Also, the chosen deposition technique is not meant to limit the scope of the invention. For example, in this embodiment, the basic structure of VCSEL 10 is formed using metallorganic chemical vapor deposition (MOCVD). However, it will be understood that VCSEL 10 may be formed using chemical vapor deposition, sputtering, molecular beam epitaxy, or combinations thereof. Further, although a single VCSEL is illustrated, generally, a plurality of VCSELs are deposited or formed in blanket layers over an entire wafer so that a large number of VCSELs are fabricated simultaneously.

In this embodiment, substrate 12 includes gallium arsenide (GaAs). However, the choice of substrate material and the material included in active region 18 generally depends on a desired wavelength of operation which in this embodiment is between approximately 0.7 µm to 1.0 µm. It will also be understood that the wavelength range from 0.7 µm to 1.0 µm is typically used in optical communication applications, such as fiber optical networks. However, other wavelength ranges may be suitable for a given application.

As is understood in the art, DBRs 16 and 20 include a stack of alternate layers of materials wherein each adjacent layer has a different index of refraction. For example, DBRs 16 and 20 in this embodiment include alternate layers of semiconductor material, such as alternate layers of an alloy of AlGaAs, with different proportions of material to change the index of refraction, or alternate layers of aluminum arsenide (AlAs) and gallium arsenide (GaAs). It will be understood that DBRs 16 and 20 may include other suitable reflective materials that are stacked alternately between a high and a low index of refraction. Further, in the preferred embodiment, each layer in DBRs 16 and 20 have thicknesses approximately equal to one quarter of the wavelength of operation to provide a desired reflective property. Also, while lower DBR 16 is illustrated as being doped for n-type conductivity and upper DBR 20 is illustrated as being doped for p-type conductivity, it will be understood that the conductivities could be changed and the present formation is only for purposes of explanation.

Active region 18 may include from one to a plurality of quantum structure layers with a band gap wavelength wherein each quantum structure layer emits light at the wavelength of operation. For example, active region 18 may include layers of aluminum gallium arsenide (AlGaAs), gallium arsenide (GaAS), or indium gallium arsenide (InGaAS). It will be understood that active region 18 may include quantum wells or other device structures with suitable light emission properties, such as quantum dots or similar device structures. The quantum structure layers, quantum wells, quantum dots, etc. are spaced within active region 18 in a well known manner to provide the desired light generation.

Once the basic structure, including lower DBR 16, active region 18, and upper DBR 20 is completed, an etching process is performed in a ring-shaped area to remove a cylindrical volume 24 from upper DBR 20 to define a mesa 25 in upper DBR 20. The etching process continues through DBR 20 to within a few mirror pairs of active region 18. Further, the etching process is performed so that more mirror pairs remain near the base of mesa 25 and less mirror pairs remain as the lateral distance from mesa 25 (within volume 24) increases. That is, the angle between the vertical side of mesa 25 and the surrounding upper surface of DBR 20 is greater than ninety degrees. This 'rounding' of the mesa corner reduces the stress effect within the crystalline material and improves reliability. Also, mesa 25 is formed to provide an optical and current confinement region.

Once volume 24 is etched as described above, a second etch step is performed within concentric cylindrical volume 24 to form an isolation trench 28, spaced from mesa 25, that extends through the remaining mirror pairs in upper DBR 20, active region 18, and into lower DBR 16. Isolation trench 28 (and volume 24) extends concentrically around mesa 25 and is included to reduce current leakage and device capacitance. The trench etching step can be performed before or after an implant step, which is described in detail below, depending upon the convenience and continuity of the various steps. For example, a first etch followed immediately by a second etch may be more convenient than interspersing an implant step between.

With at least the mesa defining etching process completed, a proton implant process is performed on the side wall of mesa 25 and the remaining DBR mirror pairs immediately under volume 24 to form implant area 30. Generally, the mirror pairs remaining adjacent mesa 25 are sufficient so that proton implant area 30 adjacent mesa 25 is close but does not extend into active region 18. However, as the lower surface of cylindrical volume 24 extends laterally a greater distance from mesa 25, e.g. adjacent isolation trench 28, implant area 30 gradually begins to extend into active region 18. In a specific embodiment, the implant is from one to four DBR pairs of layers, or approximately 0.1 to 0.5 um. This was achieved using an implant energy in a range of approximately 30 to 70 KV with proton implant.

The etching of cylindrical volume 24, including the side wall of mesa 25, causes crystalline damage with dangling bonds and defects at the etch surface which in turn causes unwanted carrier trapping and non-radiative carrier recombination. However, implant region 30 has a high resistance to electrical current flow so that electrical current will not flow in the implanted area and, therefore, non-radiative carrier recombination cannot occur in the damaged crystalline etched portions. Also, because implant region is on the surface and relatively thin, deep implants are not required and the entire implant process can be very accurately controlled. Further, since the implant is adjacent the surface (very shallow) a less complicated proton implant can be used. Here it should be noted that most prior art implants in VCSELs were made through most or even the entire upper mirror stack, thereby requiring the lighter ion implants. Implant region 30 is provided to stop or prevent current/carrier recombination activated defect propagation from the etched side wall of mesa 25 into active area 18 to substantially improve the reliability of VCSEL 10. Thus, a combination of etching and implant procedures are used to fabricate VCSEL 10 with all the advantages of both processes and none or few of the disadvantages.

VCSEL 10 is then planarized using benzocyclobutene (BCB) dielectric (Cyclotene™ from Dow) or some convenient polyimide materials 32 to provide for better metallization coverage and to reduce device capacitance for high speed operation. In addition, BCB is a low-k dielectric material and further helps reduce the VCSEL parasitic capacitance. A p-contact metal ring 34 is concentrically deposited on the upper surface of mesa 25 and an n-contact metal layer 35 is applied to the rear surface (lower surface in FIG. 1) of substrate 12. An insulating and passivating coating 38 of some convenient silicon-oxide-nitride silicon nitride, or the like is applied to the upper surfaces of VCSEL 10. An opening is provided in coating 38 at least over a portion of p-contact metal ring 34. A top bond-pad metal layer 40 is deposited in contact with the exposed portion of p-contact metal ring 34 and extending over a convenient portion of coating 38.

Thus, a reliable high performance VCSEL for high speed optical communications is disclosed. The new and improved VCSELs are constructed to operate reliably at high frequencies and with reduced current leakage and device capacitance. Basically, the new and improved VCSELs are fabricated using a convenient mixture of etching and shallow implanting to provide a device having all of the advantages of both processes while eliminating substantially all of the disadvantages.

While the steps of the fabrication method have been described, and will be claimed, in a specific order, it will be clear to those skilled in the art that various steps and procedures may be performed in different orders. It is intended, therefore, that the specific order described or claimed for the various fabrication steps does not in any way limit the invention and any variations in order that still come within the scope of the invention are intended to be covered in the claims.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

The invention claimed is:

1. A vertical cavity surface emitting laser comprising:
   a lower distributed Bragg reflector;
   an active region positioned on the lower distributed Bragg reflector;
   an upper distributed Bragg reflector positioned on the active region;
   a cylindrical volume removed from the upper distributed Bragg reflector defining a mesa with a substantially vertical side wall concentrically surrounded by the cylindrical volume, an isolation trench formed in a lower surface of the cylindrical volume concentric with the mesa;
   an implant region including a portion of the side wall of the mesa and a portion of the upper distributed Bragg reflector below the lower surface of the cylindrical volume;
   a planarizing material filling the cylindrical volume; and
   n and p electrical contacts coupled to opposite sides of the active region for supplying operating current thereto;
   wherein the lower surface of the cylindrical volume is formed so that more mirror pairs of the upper distributed Bragg reflector remain adjacent the mesa and less mirror pairs remain as the lateral distance from the mesa increases.

2. A vertical cavity surface emitting laser as claimed in claim 1 wherein the lower surface of the cylindrical volume forms an angle greater than ninety degrees with the side wall of the mesa.

3. A vertical cavity surface emitting laser as claimed in claim 1, wherein the implant region in the lower surface of the cylindrical volume extends at least into the active region adjacent the isolation trench.

4. A vertical cavity surface emitting laser as claimed in claim 1 wherein the planarizing material filling the cylindrical volume includes a low-k dielectric material.

5. A vertical cavity surface emitting laser as claimed in claim 1 wherein the implant region includes as least some of the cylindrical volume surface.

6. A vertical cavity surface emitting laser as claimed in claim 1 wherein the implant region includes proton implants.

7. A vertical cavity surface emitting laser as claimed in claim 1, wherein implant region in the lower surface of the cylindrical volume extends into the lower distributed Bragg reflector.

8. A vertical cavity surface emitting laser comprising:
   a lower distributed Bragg reflector including a plurality of pairs of mirror elements;
   an active region positioned on the lower distributed Bragg reflector;
   an upper distributed Bragg reflector including a plurality of pairs of mirror elements positioned on the active region;
   a cylindrical volume removed from the upper distributed Bragg reflector defining a mesa with a substantially vertical side wall concentrically surrounded by the cylindrical volume, an isolation trench formed in a lower surface of the cylindrical volume concentric with the mesa, the lower surface of the cylindrical volume, being formed so that more mirror pairs of the upper distributed Bragg reflector remain adjacent the mesa and less mirror pairs remain as the lateral distance from the mesa increases whereby the lower surface of the cylindrical volume forms an angle greater than ninety degrees with the side wall of the mesa;
   an implant region adjacent a surface of the cylindrical volume including the side wall of the mesa and the upper distributed Bragg reflector defining the lower surface of the cylindrical volume;
   a planarizing material filling the cylindrical volume; and
   n and p electrical contacts coupled to opposite sides of the active region for supplying operating current thereto.

9. A method of fabricating a high frequency vertical cavity surface emitting laser comprising the steps of:
   a) providing a lower distributed Bragg reflector on a substrate, an active region on the lower distributed Bragg reflector, and an upper distributed Bragg reflector on the active region;
   b) etching a cylindrical volume from the upper distributed Bragg reflector to define a mesa with a substantially vertical side wall, the cylindrical volume extending into the upper distributed Bragg reflector to a lower surface adjacent the active region;
   c) etching an isolation trench in the lower surface of the cylindrical volume concentric with the mesa and extending through the active region;
   d) implanting a portion of the side wall of the mesa and the lower surface of the cylindrical volume; and
   e) planarizing the upper distributed Bragg reflector and coupling n and p electrical contacts to opposite sides of the active region for supplying operating current thereto;
   wherein step b) includes etching the cylindrical volume so that the lower surface of the cylindrical volume forms an angle greater than ninety degrees with the side wall of the mesa, and etching the cylindrical volume so that more mirror pairs of the upper distributed Bragg reflector remain adjacent the mesa and less mirror pairs remain as the lateral distance from the mesa increases.

10. The method of claim 9, wherein step d) includes proton implanting the side wall of the mesa and the lower surface of the cylindrical volume.

11. The method of claim 10, wherein step d) includes implanting the lower surface of the cylindrical volume so that the implant extends at least into the active region adjacent the isolation trench.

12. The method of claim 10, wherein step d) includes implanting the lower surface of the cylindrical volume so that the implant extends into the lower distributed Bragg reflector adjacent the isolation trench.

13. The method of claim 9, wherein step a) includes epitaxially growing the lower distributed Bragg reflector on the substrate, epitaxially growing the active region on the lower distributed Bragg reflector, and epitaxially growing the upper distributed Bragg reflector on the active region.

14. The method of claim 9, wherein step e) includes filling the cylindrical volume with one of benzocyclobutene (BCB) dielectric and a polyimide material.

15. A method of fabricating a high frequency vertical cavity surface emitting laser comprising the steps of:
   epitaxially growing a lower distributed Bragg reflector on a substrate, epitaxially growing an active region on the lower distributed Bragg reflector, and epitaxially growing an upper distributed Bragg reflector on the active region;
   etching a cylindrical volume from the upper distributed Bragg reflector to define a mesa with substantially vertical side wall, the upper distributed Bragg reflector being etched so that a lower surface of the cylindrical volume forms an angle greater than ninety degrees with the side wall of the mesa, and further etching the cylindrical volume so that more mirror pairs of the upper distributed Bragg reflector remain adjacent the mesa and less mirror pairs remain as the lateral distance from the mesa increases;
   etching an isolation trench in the lower surface of the cylindrical volume concentric with the mesa and extending through the active region;
   proton implanting a portion of the side wall of the mesa and the lower surface of the cylindrical volume; and
   planarizing the upper distributed Bragg reflector and coupling n and p electrical contacts to opposite sides of the active region for supplying operating current thereto.

16. The method of claim 15 wherein the step of proton implanting the lower surface of the cylindrical volume includes implanting the lower surface of the cylindrical volume so that the implant extends at least into the active region adjacent the isolation trench.

17. The method of claim 15 wherein the step of planarizing includes filling the cylindrical volume with one of BCB dielectric and a polyamide.

18. A vertical cavity surface emitting laser comprising:
   a lower distributed Bragg reflector including a plurality of pairs of mirror elements;
   an active region positioned on the lower distributed Bragg reflector;
   an upper distributed Bragg reflector including a plurality of pairs of mirror elements positioned on the active region;
   a cylindrical volume removed from the upper distributed Bragg reflector defining a mesa with a substantially vertical side wall concentrically surrounded by the cylindrical volume, the lower surface of the cylindrical volume being formed so that more mirror pairs of the upper distributed Bragg reflector remain adjacent the mesa and less mirror pairs remain as the lateral distance from the mesa increases whereby the lower surface of the cylindrical volume forms an angle greater than ninety degrees with the side wall of the mesa;
   an implant region adjacent a surface of the cylindrical volume including the side wall of the mesa and the upper distributed Bragg reflector defining the lower surface of the cylindrical volume;
   a planarizing material filling the cylindrical volume; and
   n and p electrical contacts coupled to opposite sides of the active region for supplying operating current thereto.

19. A vertical cavity surface emitting laser as claimed in claim 18, wherein the implant region in the lower surface of the cylindrical volume extends at least into the active region.

20. A vertical cavity surface emitting laser as claimed in claim 18, wherein implant region in the lower surface of the cylindrical volume extends into the lower distributed Bragg reflector.

* * * * *